United States Patent [19]

Matsuoka et al.

[11] Patent Number: 4,881,639

[45] Date of Patent: Nov. 21, 1989

[54] IC CARRIER

[75] Inventors: Noriyuki Matsuoka; Masaaki Kubo, both of Tokyo, Japan

[73] Assignee: Yamaichi Electric Mfg. Co., Ltd., Tokyo, Japan

[21] Appl. No.: 313,604

[22] Filed: Feb. 22, 1989

[30] Foreign Application Priority Data

Feb. 26, 1988 [JP] Japan ................. 63-43976

[51] Int. Cl.[4] ............................ B65D 85/62
[52] U.S. Cl. .................... 206/328; 206/560
[58] Field of Search ............. 206/328, 329, 331, 332, 206/334, 560

[56] References Cited

U.S. PATENT DOCUMENTS

| 3,615,006 | 10/1971 | Freed | 206/328 |
| 4,329,642 | 5/1982 | Luthi et al. | 206/328 |
| 4,483,441 | 11/1984 | Akizawa et al. | 206/328 |
| 4,535,887 | 8/1985 | Egawa | 206/328 |
| 4,681,221 | 7/1987 | Chickanosky et al. | 206/328 |

Primary Examiner—Joseph Man-Fu Moy
Attorney, Agent, or Firm—Wenderoth, Lind & Ponack

[57] ABSTRACT

An IC carrier comprising a generally rectangular carrier body including a generally rectangular IC accommodating section at a generally central portion thereof, torsion bars each disposed at each corner portion of the carrier body, each torsion bar being disposed on a line opposite each corner portion of the IC accommodating section and diagonally crossing two sides forming the corner portion of the carrier body, resiliently displaceable latch arms each rising from each of the torsion bars, and engaging claws each formed on a free end of each of the latch arms and adapted to engage with an upper edge portion of each of the corner portions of an IC package of a generally rectangular shape accommodated in the IC accommodating section.

2 Claims, 5 Drawing Sheets

IC CARRIER

BACKGROUND OF THE INVENTION

1. Field of the Invention

This invention relates to an IC carrier for carrying an IC package thereon and used for conveying and placing the same in an IC socket.

2. Brief Description of the Prior Art

Japanese Patent Application Early Laid-open Publication No. Sho 58-56444 shows a one piece type IC carrier in which latch arms for holding an IC package are integrally formed with an IC body. Particularly, in its FIG. 9, it is proposed that latch arms are disposed in such a manner as to engage with the four corner portions of the IC package, respectively. This IC carrier is favorably carried out or put into practice in case the IC package is provided with leads projecting in four directions thereof.

In this prior art, the latch arms to be engaged with the four corner portions of the IC package are disposed in such a manner as to be parallel with two opposite sides of a carrier body, the latch arms being connected with torsion bars which are disposed in such a manner as to be parallel with the remaining two opposite sides of the carrier body, the latch arms being extended from the torsion bars in parallel with the IC leads and each provided with an engaging claw projecting sideward from its free end so that the engaging claws will be engaged with the four corner portions.

In the conventional example, as described above, the latch arms extend in such a manner as to be parallel with two opposite sides of a carrier body and the torsion bars likewise extend in such a manner as to be parallel with the remaining two opposite sides of the carrier body. Therefore, if the strokes of the latch arms and the torsion bars are to be taken long in order to obtain a favorable resiliency, the vertical width and the lateral width of the carrier body become inevitably long thus resulting in a large size of the carrier body.

Also, in case the IC leads are arranged in high density along the four sides of the IC package and the space between the lead groups which are arranged along the adjacent sides is narrow, it is necessary that, as described above, the latch arms extend in such a manner as to be parallel with the leads at the end portions of the respective lead groups along the respective sides and the latch arms are each provided with an engaging claw projecting sideward from its free end. In this way, in case the engaging claw projecting sideward displaced from the axial line of each of the latch arms is brought to be engaged with the IC package, a twisting force is acted on the latch arm. Against such twisting force of the latch arm, the torsion bar becomes a rigid body and loses its own function as a torsion bar. That is, the torsion bar becomes incapable when the latch arm is twist energized. The torsion bar exhibits its own function as a torsion bar only when the latch arm is resiliently displaced in the engaging direction and in the disengaging direction (the directions parallel with the two opposite sides of the carrier body).

Therefore, the aim for providing the torsion bars and the latch arms to each corner of the carrier body is badly lessened. In addition, the carrier body becomes large inevitably.

The present invention has been accomplished in order to overcome the above-mentioned drawbacks inherent in the prior art.

SUMMARY OF THE INVENTION

It is therefore an object of the present invention to provide an IC carrier in which a carrier body can be made comparatively small.

Another object of the present invention is to provide an IC carrier in which comparatively long strokes of latch arms and torsion bars are obtainable in comparatively limited corner portion space.

A further object of the present invention is to provide an IC carrier in which the effects of torsion bars are not reduced as experienced in the prior art wherein engaging claws project toward position displaced from the axial lines of latch arm.

In order to achieve the above objects, there is essentially provided an IC carrier comprising a generally rectangular carrier body including a generally rectangular IC accommodating section at a generally central portion thereof, torsion bars each disposed at each corner portion of the carrier body, each torsion bar being disposed on a line opposite each corner portion of the IC accommodating section and diagonally crossing two sides forming the corner portion of the carrier body, resiliently displacable latch arms each rising from each of the torsion bars, and engaging claws each formed on a free end of each of the latch arms and adapted to engage with an upper edge portion of each of the corner portions of an IC package of a generally rectangular shape accommodated in the IC accommodating section.

Also, the engaging claw is formed on an under surface thereof with an inclined engaging surface which is inclined upwardly as it goes to a tip of the engaging claw and the engaging claw engages with the upper edge portion of the corner portion of the IC package at the inclined engaging surface.

In the present invention, since a torsion bar is disposed on a line diagonally crossing two sides forming a corner portion of a carrier body, the stroke thereof can be taken long within a range not to interfere with a lead group of each row.

Similarly, since the latch arm connected with the torsion bar is disposed on and raised from a generally diagonal line of an IC accommodating section, i.e., a carrier body, a comparatively long stroke can be taken in a comparatively limited space compared with a case where the latch arm extends in parallel with the leads. Therefore, there can favorably be taken advantage of the twist resilient function of a torsion bar and the resilient displacing function of a latch arm.

Also, in the conventional example, since the latch arm extends in parallel with two opposite sides of the carrier body and since the torsion bar extends in parallel with the remaining two opposite sides of the carrier body, the strokes of the latch arm and the torsion bar must be taken long in order to obtain a favorable resiliency and, as a result, the vertical width or the lateral width of the carrier body must be taken long thus resulting in a large size of the carrier body. On the contrary, in the present invention, as described above, since the torsion bar is disposed on a line diagonally crossing two sides forming a corner portion of the carrier body and since the latch arm extends from the torsion bar in such a manner as to be resiliently displaced on the diagonal line of the IC accommodating section, the carrier body can be made as small as possible and yet a necessary length of stroke can be obtained for each of them.

The above objects and still further objects of the present invention will immediately become apparent to those skilled in the art after consideration of the following preferred embodiments of the present invention with reference to the accompanying drawings.

BRIEF DESCRIPTION OF THE DRAWINGS

FIG. 6(A) and 6(B) are sectional views taken on line B—B of FIG. 3, wherein FIG. 6(A) is a view before placement of the IC package and FIG. 6(B) is a view after placement of the IC package;

FIGS. 7(A) and 7(B) are sectional views taken on line C—C of FIG. 3, wherein FIG. 7(A) is a view before placement of the IC package and FIG. 7(B) is a view after placement of the IC package;

DETAILED DESCRIPTION OF THE EMBODIMENT

One preferred embodiment of the present invention will now be described with reference to FIGS. 1 through 8.

1 denotes a carrier body made of a synthetic resin. The carrier body 1 exhibits a generally rectangular shape and includes an IC accommodating section 2 opened up generally at its central portion. The IC accommodating section 2 exhibits a generally rectangular shape and accommodates a generally rectangular IC package 3 therein as such that the respective sides are parallel with each other.

Figure 1:
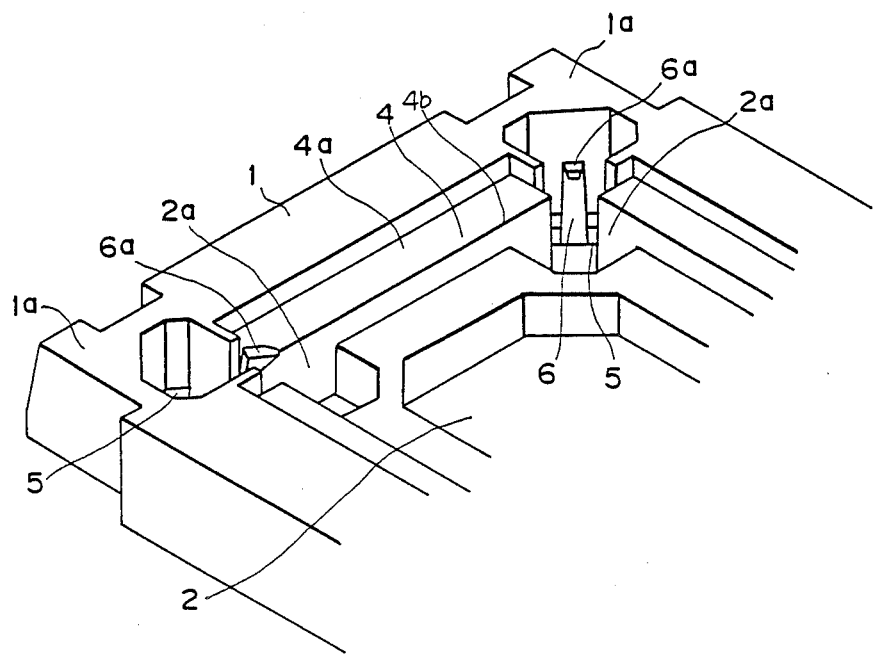
FIG. 1 is a perspective view of an important part of an IC carrier showing one embodiment of the present invention.
Figure 2:
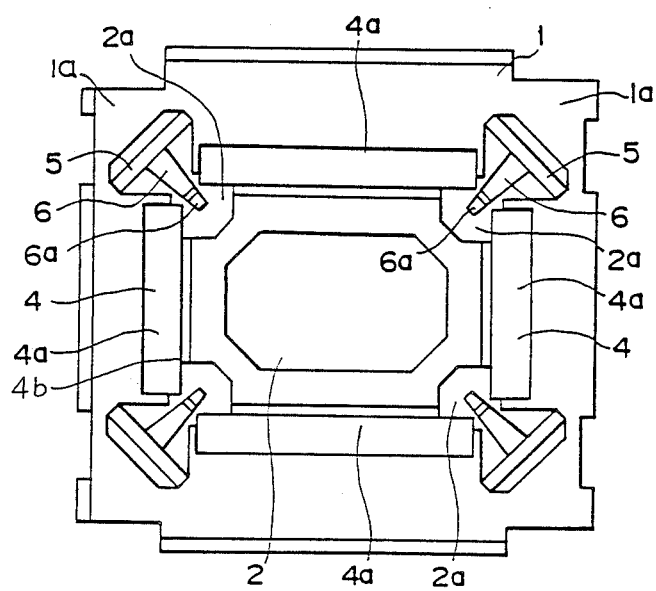
FIG. 2 is a plan view of the IC carrier of FIG. 1.
Figure 3:
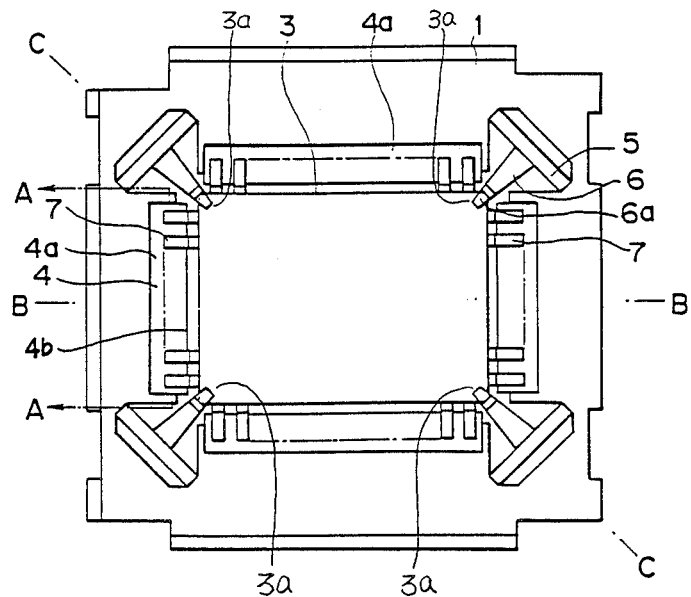
FIG. 3 is likewise a plan view of the IC carrier of FIG. 1 with an IC package placed therein.
Figure 4:
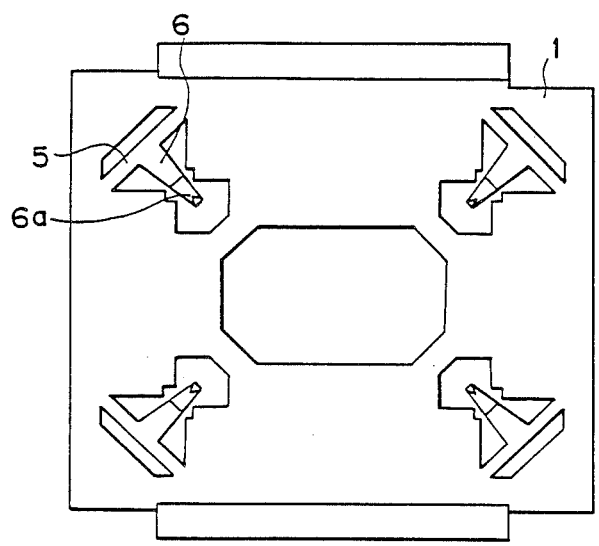
FIG. 4 is a rear view of the IC carrier.
Figure 5:
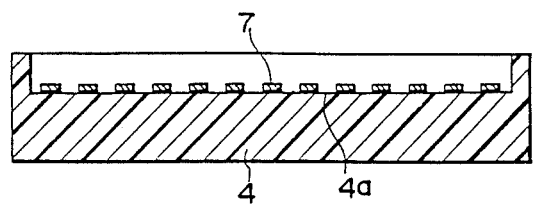
FIG. 5 is a sectional view taken on line A—A of FIG. 3.
Figure 6:
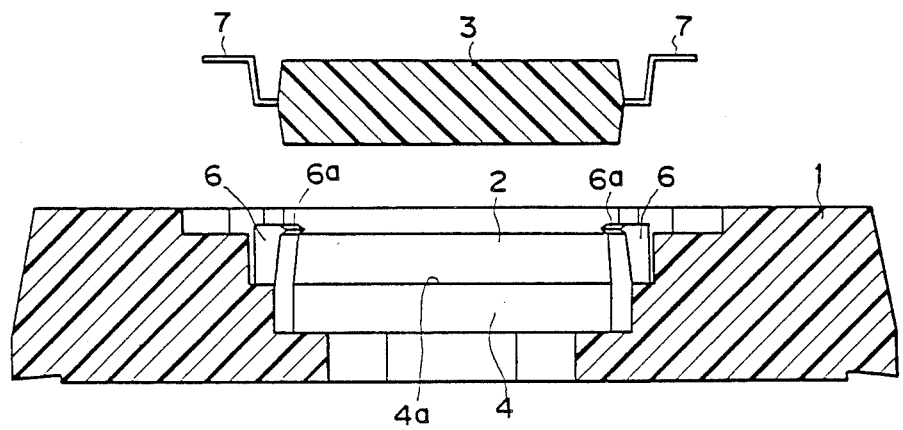
Figure 6:
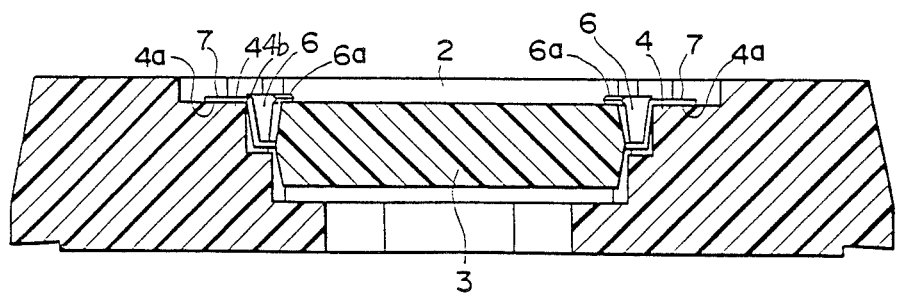
Figures 7A, 7B:
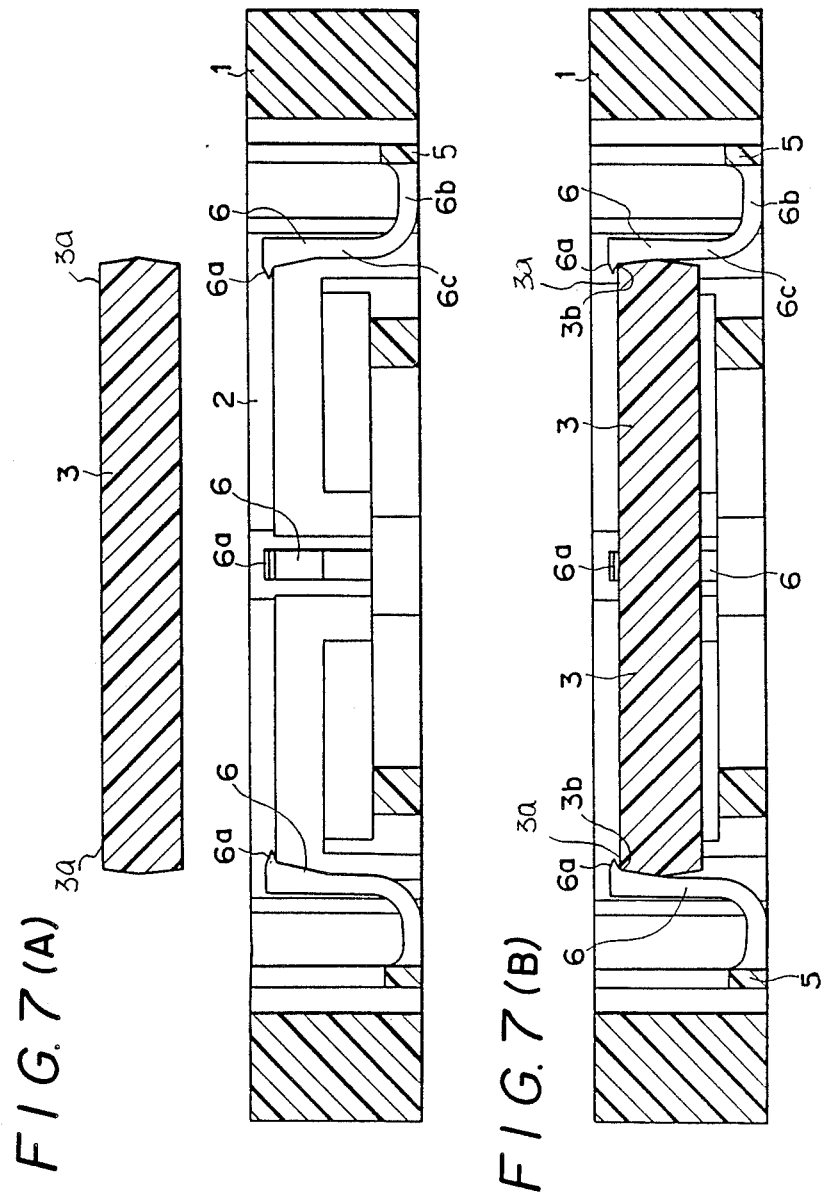

Each of two opposite sides or four opposite sides of the IC accommodating section 2, as shown in FIGS. 1 and 2, is provided with a pedestal 4 for accommodating each group of leads 7 projecting sideward from each side of the IC package 3 along each of said sides per each row. The pedestals 4 are each provided with a plain lead supporting surface 4a for supporting each group of the leads 7 per each row. That is, the lead supporting surface 4a is not provided with any slot for accommodating individual leads 7 of each row nor any slot partition wall. Instead, the lead supporting surface 4a formed of a plain surface having a width which is substantially the same to that of the row of the group of leads 7 projecting sideward from each side of the IC package 3. As is shown in FIG. 3 and FIG. 5, each group of the leads 7 projecting from each side of the IC package 3 is supported on the plain lead supporting surface 4a per each row as a package. At the same time, each pedestal 4 defines the IC accommodating section and correctly position the IC package 3 by regulating bending portions of the leads 7 with its front edge angular portion 4b or, when the leads 7 exhibit a linear state, by regulating the side surface of the body of the IC package 3 with its front edge angular portion 4b. That is, the pedestal 4 also acts as a means for positioning the IC package.

Torsion bars 5 are each disposed at the respective corner portions 1a of the carrier body 1. Each of the torsion bars 5 is disposed on a line opposite the respective corner portions 2a and diagonally crossing two sides which form the corner portion 1a of the carrier body 1.

A latch arm 5 is raised in such a manner as to be resiliently displaced on a generally diagonal line of the IC accommodating section from each of the torsion bars 5. The latch arms 5 are each provided on its free end with an engaging claw 6a to be engaged with a corner portion upper edge portion 3b of the IC package 3 accommodated in the IC accommodating section 2 and exhibiting a generally rectangular shape. The engaging claw 6a is disposed on an axial line of the latch arm 6.

The latch arm 6 includes a substrate portion 6b extending generally along the diagonal line of the IC accommodating section 2 from the torsion bar 5 and a rising portion 6c extending upward from the substrate portion 6b on the diagonal line. The engaging claw 6a projects toward the corner portion 2a of the IC accommodating section 2 from a free end of the rising portion 6c on the diagonal line, i.e., on the diagonal line of the latch arm 6.

Figure 8A:
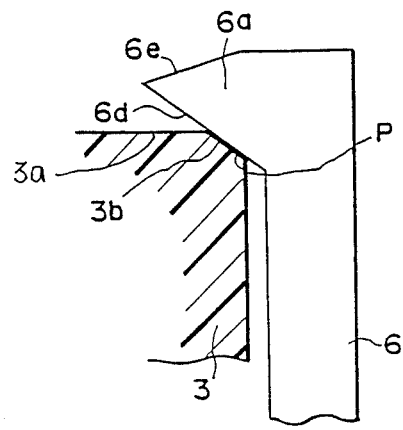
FIG. 8(A) is an enlarged sectional view showing an engaging state of a latch arm and the IC package.
Figure 8B:
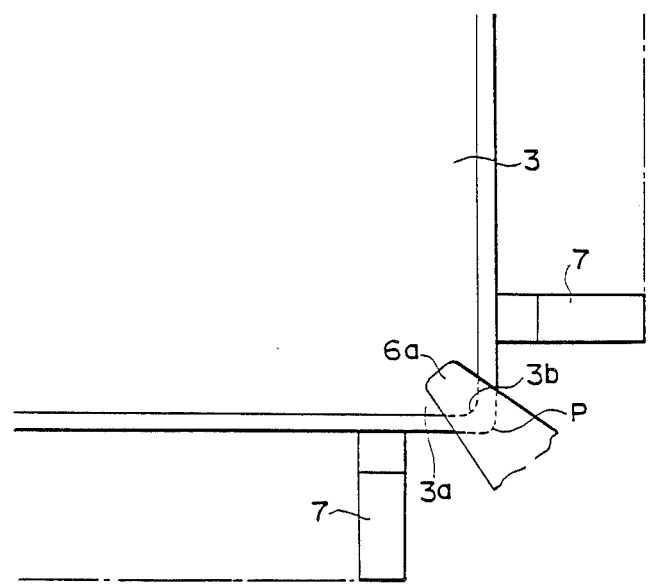
FIG. 8(B) is an enlarged plan view of FIG. 8(A).

As is shown in FIG. 8, the engaging claw 6a projects on the diagonal line as described and is provided on its under surface with an inclined engaging surface 6d which is upwardly inclined as it goes toward the tip of the engaging claw 6a. The engaging claw 6a is disposed as such that the inclined engaging surface 6d, as shown in FIG. 8(A) and 8(B), is engaged with the upper edge portion 3b of the corner portion 3a of the IC package 3. The inclined engaging surface 6d, when engaged with the upper edge portion 3b of the corner portion 3a of the IC package 3, urges an intersecting point part P of the two sides forming the corner portion 3a forwardly and downwardly at angle.

Also, the engaging claw 6a is provided on its upper surface with an inclined guide surface 6e which is inclined downwardly as it goes toward the tip of the engaging claw 6a. The inclined guide surface 6e, when the IC package is placed, is urged by its lower edge portion to resiliently displace the latch arm 6 outwardly along the diagonal line and, after receiving the IC package 3, the latch arm 6 is resiliently restored inwardly to engage with the IC package 3 at the intersecting point P between the inclined engaging surface 6d and the upper edge portion 3b of the IC package 3.

When the IC package 3 is to extracted, the inclined engaging surface 6d functions as a guide surface for enhancing a smooth extraction of the IC package 3. The latch arm 6 is displaced backwardly along the diagonal line because the inclined engaging surface 6d is urged by the upper edge portion 3b of the corner portion thereby to permit the IC package 3 to be extracted. When the latch arm 6 is resiliently displaced between the engaging position and the disengaging position along the the diagonal line as described above, the torsion bar 5 exhibits a favorable twist resilient effect.

As described in the foregoing, in the conventional example, since latch arms extend in parallel with two opposite sides of a carrier body and since torsion bars extend in parallel with the remaining two sides of the carrier body, the strokes of the latch arms and the torsion bars must be taken long in order to obtain a satisfactory resiliency and as a result, the vertical width and the lateral width of the carrier body become inevitably long which results in a large size of the carrier body. In the present invention, however, as described above, since torsion bars are each disposed on a line diagonally crossing two sides which form a corner portion of a carrier body and since latch arms each extend from the respective torsion bar in such a manner as to be resiliently displaced on the diagonal line of an IC accommodating section, the carrier body can be made as small as possible.

In addition, in the present invention, since the torsion bar is disposed on the line diagonally crossing the two sides which form the corner portion of the carrier body and since the latch arm connected with the torsion bar is raised in such a manner as to be resiliently displaced generally on and along the diagonal line of the IC accommodating section, a comparatively long stroke can be obtained in a comparatively limited space compared with the conventional case where the latch arms and torsion bars respectively extend in parallel with two sets of opposite sides of the carrier body and when the IC package is to be placed and removed, the torsion bars exhibit their favorable twist resilient displacing functions. Thus, the arrangement of the present invention has successfully overcome the drawback of the prior art in which the effects of the torsion bars are reduced in the case where the engaging claw projects toward position displaced from the axial line of the latch arm.

What is claimed is:

1. An IC carrier comprising a generally rectangular carrier body including a generally rectangular IC accommodating section at a generally central portion thereof, torsion bars each disposed at each corner portion of said carrier body, each torsion bar being disposed on a line opposite each corner portion of said IC accommodating section and diagonally crossing two sides forming the corner portion of said carrier body, resiliently displacable latch arms each rising from each of said torsion bars, and engaging claws each formed on a free end of each of said latch arms and adapted to engage with an upper edge portion of each of the corner portions of an IC package of a generally rectangular shape accommodated in said IC accommodating section.

2. An IC carrier as claimed in claim 1, wherein said engaging claw is formed on an under surface thereof with an inclined engaging surface which is inclined upwardly as it goes to a tip of said engaging claw and said engaging claw engages with the upper edge portion of the corner portion of the IC package at said inclined engaging surface.

* * * * *